United States Patent
Brophy et al.

(10) Patent No.: US 6,918,057 B1
(45) Date of Patent: Jul. 12, 2005

(54) ARCHITECTURE, CIRCUITRY AND METHOD FOR CONTROLLING A SUBSYSTEM THROUGH A JTAG ACCESS PORT

(75) Inventors: Brenor L. Brophy, San Jose, CA (US); Xiao Ming Xi, San Jose, CA (US); Dinesh Nadavi, Cupertino, CA (US)

(73) Assignee: Cypress Semiconductor Corp.

( * ) Notice: Subject to any disclaimer, the term of this patent is extended or adjusted under 35 U.S.C. 154(b) by 485 days.

(21) Appl. No.: 09/939,076

(22) Filed: Aug. 24, 2001

(51) Int. Cl.$^7$ .............................................. G06F 11/00
(52) U.S. Cl. ...................... 714/30; 714/820; 714/724
(58) Field of Search .......................... 714/30, 820, 724, 714/25, 48; 710/71; 324/763

(56) References Cited

U.S. PATENT DOCUMENTS

| | | | | |
|---|---|---|---|---|
| 5,355,369 A | * | 10/1994 | Greenberger et al. ........ | 714/727 |
| 5,708,773 A | * | 1/1998 | Jeppesen et al. .............. | 714/30 |
| 6,430,718 B1 | * | 8/2002 | Nayak ......................... | 714/727 |
| 6,445,205 B1 | * | 9/2002 | Fremrot et al. .............. | 324/765 |
| 6,507,213 B1 | * | 1/2003 | Dangat ......................... | 326/38 |
| 6,512,395 B1 | * | 1/2003 | Lacey et al. .................. | 326/40 |
| 6,587,942 B1 | * | 7/2003 | Chiang ........................ | 713/100 |
| 6,651,199 B1 | * | 11/2003 | Shokouhi ..................... | 714/727 |
| 6,678,850 B2 | * | 1/2004 | Roy et al. .................... | 714/730 |
| 6,691,267 B1 | * | 2/2004 | Nguyen et al. .............. | 714/725 |
| 2001/0044862 A1 | * | 11/2001 | Mergard et al. .............. | 710/71 |
| 2002/0194565 A1 | * | 12/2002 | Arabi ........................... | 714/729 |

OTHER PUBLICATIONS

Play–Hookey.com, Serial–to–Parallel Shift Register, http://web.archive.org/web/20010821221111/http://www.play-hookey.com/digital/shift-in_register.html, Aug. 21, 2001.*

\* cited by examiner

*Primary Examiner*—Robert Beausoliel
*Assistant Examiner*—Marc Duncan
(74) *Attorney, Agent, or Firm*—Kevin L. Daffer; Daffer McDaniel, LLP

(57) ABSTRACT

Architecture, circuitry, and methods are provided for programming, writing to, or reading from one or more integrated circuits which may be arranged upon a printed circuit board. Programming and read/write operations can, therefore, be done after integrated circuits are populated upon a printed circuit board to control those integrated circuits using a standard JTAG interface, well-known as the IEEE Std. 1149.1 interface. A shift register used to control one or more electronic subcomponents can be programmed, written to, or read from using JTAG programming languages. However, the shift register, or multiple shift registers, used to control electronic subcomponents need not be JTAG compliant. The shift registers may be those found within proprietary circuits, such as analog-to-digital converters or digital-to-analog converters, and include any shift register than receives serial data and produces parallel data, or vice-versa, where the loading and serial shifting of data is controlled using a generic interface, such as enable, reset, capture, etc. One or more shift registers can be distributed among one or more integrated circuits proprietary to the manufacturer of that circuit, and the circuits which embody the shift registers need not have a JTAG interface. Yet, the shift registers can be controlled by a single test access port (TAP) external to the integrated circuits, but which controls the non-JTAG compliant shift registers of each integrated circuit bearing the same. This allows a JTAG programming language which can be readily obtained off-the-shelf to control integrated circuits which do not recognize JTAG control signals, nor do such integrated circuits necessarily have a JTAG four-pin interface.

19 Claims, 4 Drawing Sheets

ARCHITECTURE, CIRCUITRY AND METHOD FOR CONTROLLING A SUBSYSTEM THROUGH A JTAG ACCESS PORT

BACKGROUND OF THE INVENTION

1. Field of the Invention

This invention relates to an architecture, circuitry and method for operating a subsystem through a test access port ("TAP"), preferably the JTAG access port described in IEEE Std. 1149.1. The subsystem includes one or more circuits that derive control from a shift register. The shift register can be a part of or separate from the subsystem, and the shift register can be written to via the serial input pin of the TAP and read from via the serial output pin of the TAP.

2. Description of the Related Art

The following descriptions and examples are not admitted to be prior art by virtue of their inclusion within this section.

In early the 1990's, a standard was developed and approved as IEEE Std. 1149.1, henceforth referred to "the Joint Test Action Group" (JTAG) standard. The JTAG standard was envisioned to allow testing of the integrated circuit after it had been assembled onto a printed circuit board. For example, multiple integrated circuits may be solder bonded to a printed circuit board, where it is desirable to test an entire electronic subsystem of multiple integrated circuits after those integrated circuits have been solder bonded to the board. The JTAG standard provided for testing numerous integrated circuits which make up an electronic subsystem while those circuits are electrically coupled to the board. The JTAG standard can, therefore, test not only the operation of multiple integrated circuits, but the interconnection of those circuits to the printed conductors of the board.

In order to test a circuit using the JTAG standard, it is important that the circuit be JTAG compliant. Specifically, the circuit must have a JTAG test access port ("TAP"). Through the TAP, the JTAG compliant integrated circuit can be tested using only four signals: a serial input signal (TDI), a serial output signal (ISDO), a clock signal (TCK), and a mode select signal (TMS). Each integrated circuit to be tested must, therefore, have a JTAG-type TAP for receiving a serial bitstream controlled by the clock and mode select signals and, in accordance with the test response, produce a serial bitstream output, all of which take place on a maximum four conductors that interface with the TAP placed internal to the JTAG compliant integrated circuit. There are various ways in which to utilize the TAP. For example, a boundary scan mechanism may be used to test one or more boundary scan cells arranged about the peripheral of each JTAG-compliant circuit. The TAP controller is used for orchestrating signal flow within and through each of the cells.

FIG. 1 illustrates an electronic subsystem 10 embodied upon possibly multiple printed circuit boards 12a and 12b. Each board 12 may have multiple integrated circuits mounted thereon. In the example provided, board 12a has two integrated circuits 14 and 16 electrically coupled to trace conductors which extend within and/or upon the planar surfaces of board 12a. For sake of brevity, only two integrated circuits are shown on board 12a. However, it is recognized that a printed circuit board may embody certainly more than two integrated circuits. Printed circuit board 12a also shows an edge connector 18 that contains multiple contacts 20. Four contacts can be reserved to receive four signals from the host computer, or automated test equipment ("ATE"), shown as reference numeral 24.

Host computer preferably contains a memory into which a test language can be stored. Preferably, the test language is one that is platform-independent, i.e., a language that is independent of the operating system of the host computer. A popular test language specifically tailored to test JTAG compliant integrated circuits based on the IEEE 1149.1 standard is the JAM™ Standard Test and Programming Language (STAPL). STAPL consists of source code that is executed directly by the interpreter program, without being first compiled into binary executable code. Information regarding the STAPL language can be obtained from Altera Corp., San Jose, Calif.

STAPL, executable by host 24, produces instructions and data as a serial bitstream, and forwards that bitstream as the TDI signal. The processor within host 24 can also produce a clock signal and a mode select signal, TCK and TMS. The clocking and mode select signals can be broadcast to corresponding pairs of input pins on each integrated circuit 14 and 16, whereas the serial bitstream is placed in one pin, and daisychained through, for example, boundary scan cells 26 of each integrated circuit, among all integrated circuits linked between TDI and TDO edge connectors 20 of board 12a. This process can be repeated by interconnecting multiple boards, whereby the TDO output from board 12a can be forwarded to the TDI input of board 12b to ensure integrated circuits on one board are daisy-chained together with integrated circuits on another board, all of which form an electronic subcomponent.

The IEEE Std. 1149.1 specification provides for the daisy-chained interconnection of multiple boundary scan cells 26, whereby the sequence of bits within the serial bitstream are loaded into corresponding elements 26 so they can then be parallel-fed into the core logic 28 and 30 of corresponding integrated circuits 14 and 16. In this fashion, a test vector represented as a sequence of 1 s and 0 s can be loaded into core logic 28 and 30 and, subsequently, based on the status of the clock and mode select signals, the response of a test vector can be read serially from core logic 28 and 30 via the serial output TDO.

The platform-independent programming language that interfaces with JTAGcompliant integrated circuits is specifically tailored not only to test the core logic of integrated circuits, but can also be used to program one or more integrated circuits. Thus, the integrated circuits can include Programmable Logic Devices (PLDs) such as those manufactured by Cypress Semiconductor Corp. Using JTAG compliant integrated circuits and software specifically written to program such integrated circuits via the four-pin TAP interface poses a significant advantage in the integrated circuit manufacturing industry. It would be desirable to maintain the well-known, four-conductor JTAG interface and JTAG-specific programming languages for JTAG-complaint circuits, yet it would be further desirable to be able to test and/or program integrated circuits which are not JTAG compliant. For example, the automated test equipment may be located a considerable distance from the electronic subcomponent. In this instance, a serial link is needed, such as that found in the JTAG interface. However, there may be one or more integrated circuits on the printed circuit board that are not JTAG compliant. Such integrated circuits would, therefore, not have a TAP, nor could such circuits recognize the clock signal and mode select signal protocol of a JTAG four-pin bus.

It may be of further benefit to not only test, but to control an electronic subsystem using the JTAG interface. Such control would desirably include sending JTAG control signals from the host computer to the electronic subsystem, a portion of which may involve an integrated circuit that is not JTAG compliant. As defined herein, an integrated circuit which is not JTAG compliant is one that does not have a TAP and does not recognize or place any significance to the JTAG clock signal and mode select signal, or any instructions contained within the serial bitstream of TDI.

SUMMARY OF THE INVENTION

The problems outlined above are in large part solved by a circuit architecture which can apply a serial bitstream and control signals compiled using an application program written to program JTAG compliant integrated circuits. Serial bitstream and control signals are, therefore, ones targeted for a JTAG compliant integrated circuit. However, the electronic subsystem being controlled by the host computer which produces the serial bitstream and control signals may not have any JTAG compliant integrated circuits or, at most, only one JTAG compliant integrated circuit. Thus, the benefits of controlling an electronic subsystem by sending a serial bitstream over rather lengthy distances from a host computer is solved by using the readily understood JTAG protocol, and the readily implemented four-pin JTAG interface.

Attributed to the electronic subsystem is a TAP which receives the serial bitstream and control signals from the host computer. The TAP may be external from an integrated circuit which forms a part of the electronic subsystem. Preferably, the TAP includes a controller which receives the control signal and either enables or disables a shift register which receives the serial bitstream. If enabled, the shift register receives the serial bitstream of instructions and/or data. Each bit of the serial bitstream can then be forwarded to a corresponding conductors attributed to the electronic subsystem so that the serial bitstream can be fed in parallel to core logic within one or more integrated circuits. The program used to arrange the serial bitstream and control signals used to control that bitstream sent to and from the shift register is obtained as an off-the-shelf programming language compatible with the JTAG interface. The serial bitstream and control signals are compatible with the JTAG interface. However, the shift register need not be compatible with JTAG or the specialized format used to arrange the serial bitstream and the control signals. Thus, unlike boundary scan elements, the shift register does not respond to nor recognize the control signals programmed according to a JTAG compliant programming language, such as STAPL. Yet, however, STAPL can be beneficially used to interface with the electronic subcomponent (i.e., control the electronic subcomponent by sending data and instruction serially to the shift register and fooling the host computer into believing it is sending information to and receiving information from an integrated circuit that is JTAG compliant. Instead, the integrated circuit can have a proprietary architecture that does not accept or recognize JTAG signals).

According to one embodiment, architecture is provided for controlling an electronic subsystem. The architecture includes multiple integrated circuits, each having a plurality of input pins adapted to receive a parallel-delivered signal used for controlling the corresponding integrated circuits. The architecture further includes a single access port adapted to receive a serial bitstream of data and convert the serial bitstream into the parallel-delivered signal selectably placed onto input pins of each of the multiple integrated circuits. The serial bitstream is derived from a host computer operating from an application program compatible with IEEE Std. 1149.1, alternatively compatible with the JTAG standard. The access port can either reside external from one of the multiple integrated circuits, or within one of the multiple integrated circuits. Although in one integrated circuit, the remaining multiple integrated circuits do not contain an access port (i.e., a TAP) and, therefore, are not JTAG compliant.

The access port includes a controller that is coupled to receive control signals (a clock signal and a mode select signal) from the host computer and for controlling a shift register to enable the shift register to accept the serial bitstream and place that bitstream into the parallel-delivered signal dependent on the state of the control signals received by the controller.

The shift register includes any shift register within one or more of the integrated circuits that can receive serialized data and place the serialized data upon the plurality of input pins dependent only on the state of the enable signal. Thus, the control signals may be compatible with the IEEE Std. 1149.1, yet the serial bitstream is any bit stream recognizable by any shift register. Thus, the controller is JTAG compliant and, therefore, recognizes JTAG control signals; however, the shift register is not. In essence, the serialized data is incompatible with IEEE Std. 1149.1 and can simply be recognized as any serial data, the control of which is modulated simply by a non-proprietary enable signal emanating from the controller.

According to yet another embodiment, an access port is provided. The access port is coupled to receive control signals for controlling a serial bitstream in accordance with IEEE Std. 1149.1. The access port comprises a single controller coupled to receive the control signals and produce an enable signal dependent on the state of the control signals. A shift register within an integrated circuit is absent circuitry compatible with IEEE Std. 1149.1, such that the shift register cannot recognize the significance of the control signal, yet does recognize a generic enable signal which is sent from the controller. Upon receiving the enable signal, the shift register receives the serial bitstream of instructions and data, and presents the serial bitstream onto corresponding conductors of one or more integrated circuits. The shift register can be any shift register within an integrated circuit that cannot recognize JTAG control signals, an example of such shift registers may be an encoder within an analog-to-digital converter, a digital-to-analog converter, or any shift register within core logic of a legacy integrated circuit that is not JTAG compliant.

According to yet another embodiment, a method is provided for controlling input to and from a plurality of conductors arranged upon at least one integrated circuit. The method includes sending control signals compliant with IEEE Std. 1149.1 onto a controller and, depending on the status of the control signals, sending an enable signal from the controller to enable a shift register that is noncompliant with IEEE Std. 1149.1. The shift register thereby receives a serial bitstream and places each bit of the serial bitstream upon corresponding ones of the plurality of conductors during a first time. Thereafter, a parallel set of bits from corresponding ones of the plurality of conductors can be received during a second time, where the parallel set of bits are converted into a second serial bitstream. Depending on an instruction within the serial bitstream, either the serial bitstream or the second serial bitstream is placed upon an output conductor extending from the integrated circuit to a host computer.

BRIEF DESCRIPTION OF THE DRAWINGS

Other objects and advantages of the invention will become apparent upon reading the following detailed description and upon reference to the accompanying drawings in which.

Figure 1:
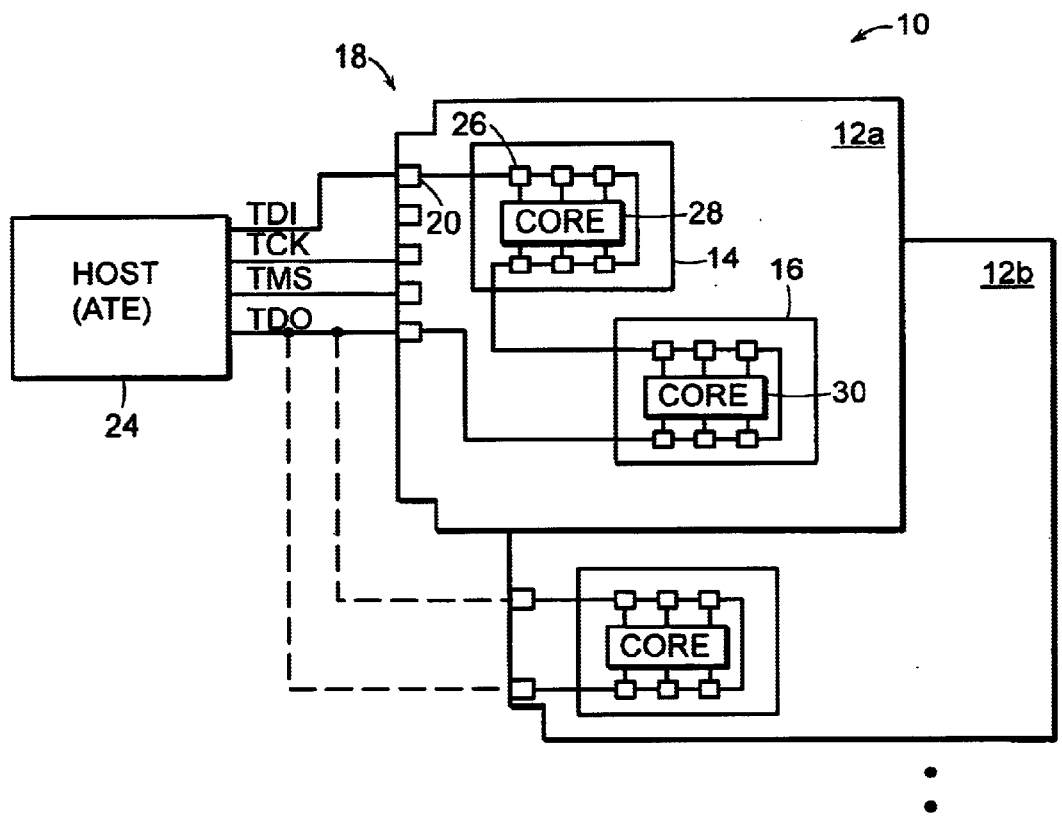
FIG. 1 is a block diagram of a host computer connected to serially send and receive data to boundary scan cells arranged upon integrated circuits interconnected to corresponding printed circuit boards.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
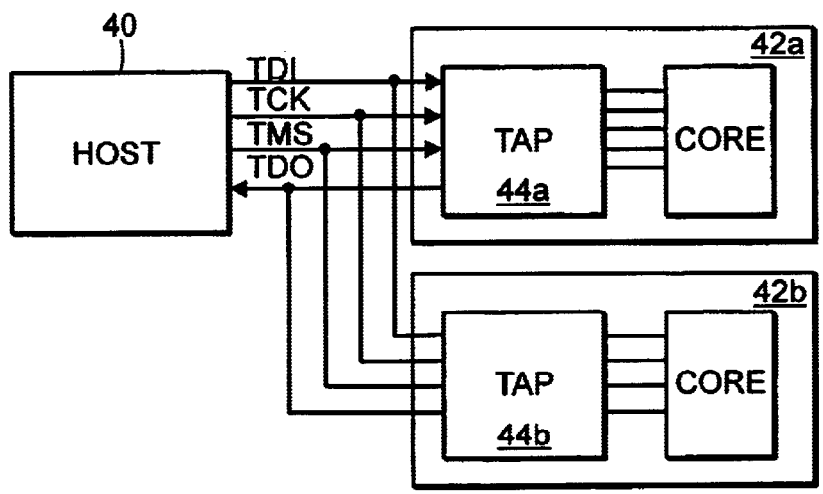
FIG. 2 is a block diagram of the host computer connected to serially send and receive data to a TAP associated with each integrated circuit.

Turning now to the drawings, FIG. 2 illustrates a host computer 40 programmed to send and receive serial data to one or more integrated circuits 42a and 42b. The serial data sent from computer 40 is presented as the TDI signal to the integrated circuits either in parallel or in series. If delivered in series, TDI is sent first to integrated circuit 42a and then to integrated circuit 42b. Thus, TDI can be daisy-chained through the access port TAP 44a, then out of TAP 44a and into TAP 44b. The clock and mode select control signals TCK and TMS are broadcast to each of the TAPs 44a and 44b.

Preferably, the serial bitstream of TDI contains instructions and data sent as a sequence of bits that are formatted and controlled in accordance with the control signals which are dispatched by call routines to a JAM™ file to bring about IEEE Std. 1149.1 protocol. The IEEE Std. 1149.1 protocol assumes JTAG compatibility with integrated circuits 42a and 42b, and that TAPs 44a and 44b will recognize the sequence and timing of the clock and mode select signals being presented in IEEE Std. 1149.1 format. Thus, while FIG. 2 illustrates the programmability of integrated circuits using well-known STAPL program languages, it would be desirable to make improvements to the overall structure of requiring an access port that is JTAG compliant in each of the integrated circuits.

Figure 3:
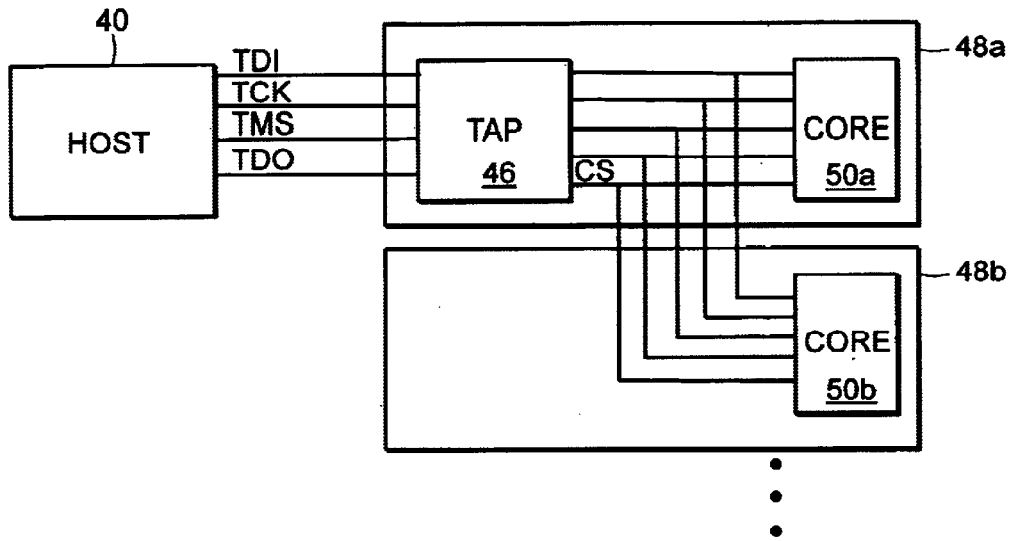
FIG. 3 is a block diagram of the host computer connected to serially send and receive data to a TAP connected to multiple integrated circuits.

FIG. 3 illustrates a more efficient program and control architecture, which uses a single access port that may be part of only one integrated circuit among multiple integrated circuits. The improvement shown in FIG. 3 from that of FIG. 2 is one that embeds all JTAG compliance requirements within TAP 46. For illustrative purposes only, TAP 46 is attributed to integrated circuit 48a and not integrated circuit 48b. Host 40 thereby forwards the appropriate signals upon three conductors and receives a response upon another conductor to complete the JTAG interface between host 40 and access port 46. Access port 46 receives the control signals and, based on those control signals, places the serial bitstream of TDI onto a shift register within access port 46. A controller within access port 46 not only enables the shift register to receive the serial bitstream, but also can send a chip select (CS) to multiple core logic devices 50a and 50b within integrated circuits 48a and 48b. The chip select signal selects which core is to receive the serial bitstream converted as a parallel-delivered bitstream to respective conductors of core 50a or core 50b. Of course, access port 46 can present the programmed serial bitstream to multiple integrated circuits, beyond the two shown, either selectively to one or more integrated circuits, or to all integrated circuits simultaneously. The portions of integrated circuit 48a and 48b outside of access port 46 need not be JTAG compliant, and only the access port 46 is JTAG compliant, so that the various circuitry within each integrated circuit exclusive of access port 46 can receive data and instructions programmed according to well-known JTAG programming languages, yet the integrated circuits outside of access port 46 need not be ones which can recognize the JTAG programming languages and/or have the firmware necessary to recognize such languages.

Figure 4:
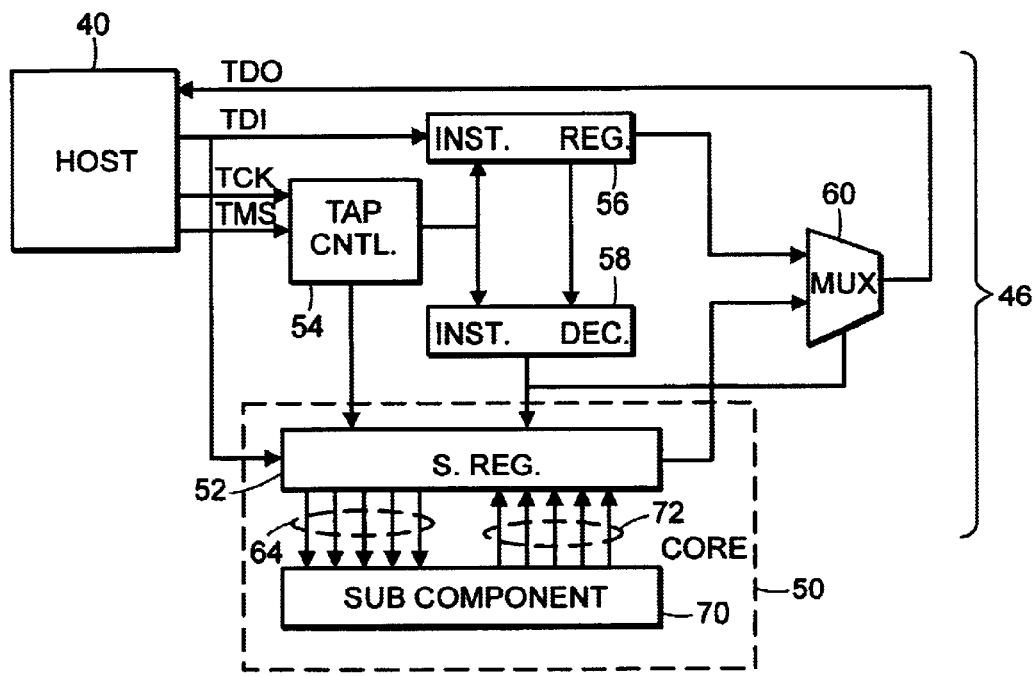
FIG. 4 is a block diagram of the shift register of the TAP being either a part of the TAP or being a part of a core circuit of an integrated circuit external and separate from the TAP.

FIG. 4 illustrates in further detail the various subcomponents of access port 46, where the shift register 52 normally attributed to access port 46 may be drawn outside of Ni the subcomponents of access port 46 that are JTAG compliant. As shown in FIG. 4, access port 46 includes a controller 54, an instruction register 56, an instruction decoder 58, and a multiplexer 60. Shift register 52 is any shift register than can receive serialized data, and place that data in parallel onto conductors of another circuit, such as core logic 50. Shift register 52 therefore supports functions within core logic, and need not be a dedicated shift register used solely as part of an access port. In this manner, the access port can use an existing shift register within the core logic without having to burden that shift register with it being JTAG compliant. The only elements of access port 46 that are JTAG compliant are controller 54, instruction register 56, and instruction decoder 58.

Controller 54 is essentially a state machine which, upon receiving the appropriate timed sequence of a clocking signal and a mode select signal (well-known in the IEEE Std. 1149.1 specification), generates a reset, enable, update, capture, or select signal to shift register 52. If, for example, the signal is an enable signal from TAP controller 54, the serial bitstream from TDI will be serially shifted into register 52 and placed at the appropriate conductor 64 to load the subcomponent circuitry that is to be programmed with control signals attributed to the serial bitstream. The functionality of the TAP controller 54, and its generation of the various control signals recognizable to any generic shift register, is advantageous since shift register 52 can be one that is distributed outside of the access port. Instruction register 56 receives the serial bitstream and dispatches that bitstream to an instruction decoder 58 depending on the state output from controller 54. If controller 54 indicates that a particular instruction is to be decoded by decoder 58, then decoder 58 will send the result of that decode operation to shift register 52 and also to multiplexer 60. The control signal from decoder 58 can include either a read operation or a write operation. For example, decoder 58 may enable shift register 52 to write the serial bitstream of TDI onto subcomponent 70 of core 50 via conductor 64 or, alternatively, the control signal may indicate a read operation from subcomponent 70 via conductors 72 as serial data that will be subsequently output from shift register 52. Accordingly, the serial bitstream of TDI can be used to program subcomponent 70 or read to subcomponent 70. Depending on the instruction within TDI, data within subcomponent 70 can be read from the subcomponent and placed within shift register 52. The control signal from the instruction decoder thereby is used to enable either the serial bitstream of TDI to be sent directly to the output conductor TDO, or the read data from subcomponent 70 to be sent to the output conductor TDO.

FIG. 4 illustrates the use of a JTAG, serial-type interface of four pins from a host computer 40 to an access port which is JTAG compliant. However, the shift register of the access port can be distributed outside the access port, and can be any register found within the core logic 50. Instead of the entire access port being JTAG compliant, only the TAP controller 54, instruction register 56, and instruction decoder 58 are JTAG compliant.

Figure 5:
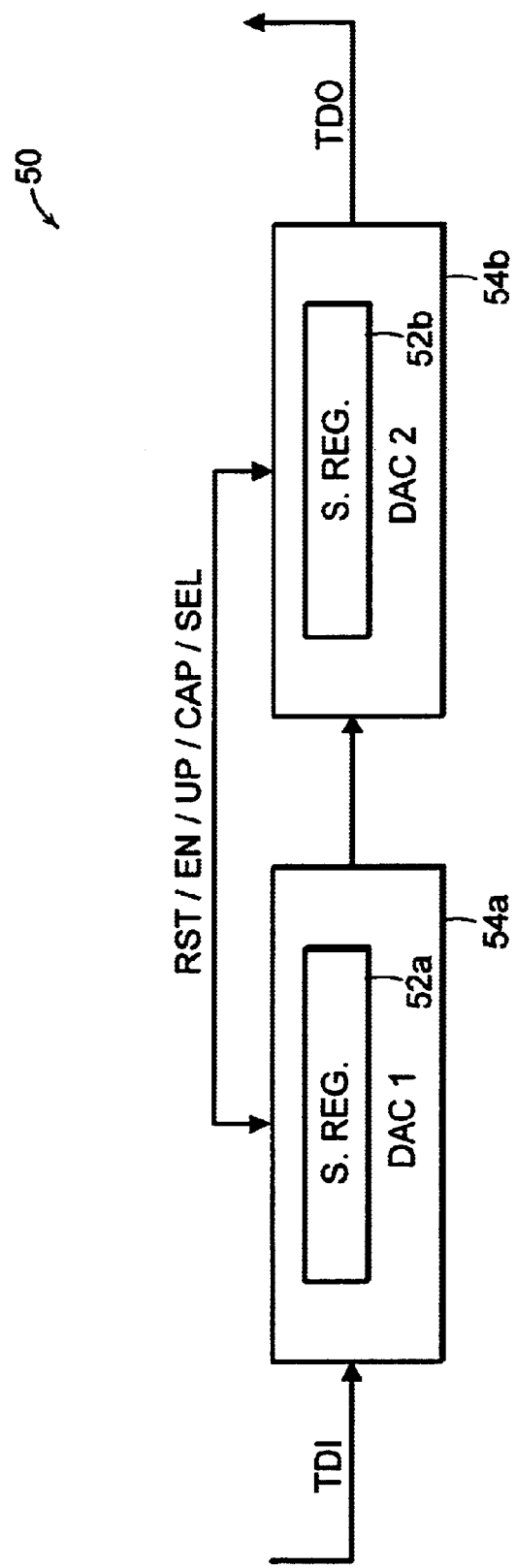
FIG. 5 is a block diagram of the shift register of the TAP being a part of a core circuit incompatible with JTAG protocol.

FIG. 5 illustrates the use of existing shift registers within core logic 50. The shift registers 52a and 52b can supplant the shift register, or shift registers, normally attributed to the access port. Shift registers 52 can be controlled from a single TAP controller that controls reset, enable, update, capture, and select signals that are forwarded to one or more shift registers within an electronic subcomponent that is to be controlled. For example, the electronic subcomponent can include a digital-to-analog converter. Normally attributed to any digital-to-analog converter (DAC) is a shift register that may be used to set the tap points of, for example, a resistor ladder network. By loading the shift register with the serial data sent from the TDI pin of the four-pin JTAG interface, the DACs 54a and 54b can be programmed to receive digital data (possibly in serial form) and convert the digital data to its corresponding analog magnitude. The digital data can be sent across the TDI conductor from, for example, an upstream integrated circuit or the host computer itself. As such, the shift registers can be daisy-chained together to provide a rather large shift register by using, for example, multiple DACs as shown.

Figure 6:
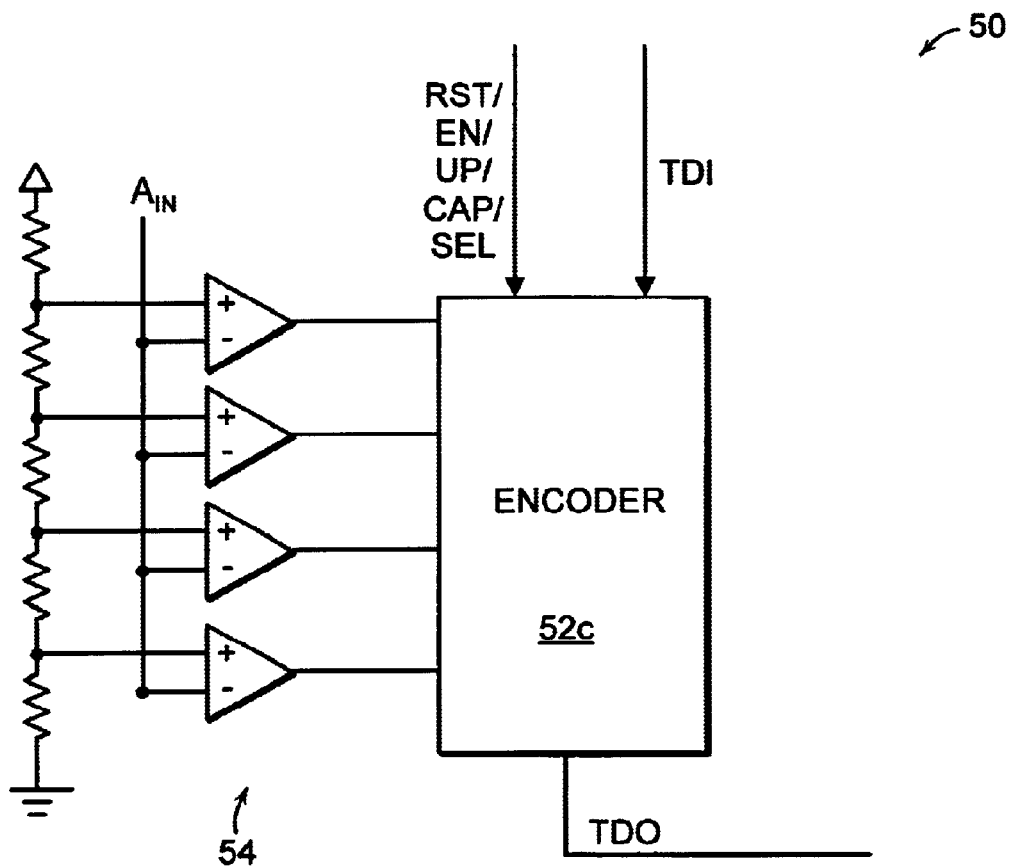
FIG. 6 is a block diagram of the shift register used to control an analog-to-digital circuit absent a TAP.

FIG. 6 illustrates a shift register 52c coupled to receive a serial bitstream from TDI. Shift register 52c can function as, for example, an encoder within an analog-to-digital converter (ADC) integrated circuit 50. The serial bitstream is placed in the register 52c; the voltage level from the compared resistor ladder and the analog input of the various comparators 54 is then modulated by the corresponding bit sequence within register 52c to formulate an appropriate digital output that can be sent serially to the single output conductor TDO.

FIGS. 5 and 6 illustrate the concept of taking a simple four wire JTAG interface and using that interface in a shift register that can be commonly found in almost any electronic subcomponent employing such shift registers. The DAC and ADC shift registers of FIGS. 5 and 6 are interfaced by internal signals that are derived from the JTAG control signals. Those internal signals allow the controller to fool the host system into thinking it is interfacing with a JTAG compliant shift register, when in fact the shift register could be a proprietary architecture of any circuit which employs, for example, an ADC or DAC.

The one or more shift registers 52 of FIGS. 4, 5 and 6 are controlled by the instruction decoder 58 and further controlled by the reset, update, and capture signals from the state machine of controller 54. Outputs of the shift register 52 are used to read and/or write data in parallel manner to external hardware that comprises the circuitry of a piece of automated test equipment, or generically referred to as an electronic subcomponent. Outputs from the instruction decoder and the controller are used to control the shift register within a device external to the access port and, in turn, the shift register controls circuitry of the automated test equipment, or electronic subcomponent. The controller 54 of FIG. 4 can be any circuit which has sequential logic. For example, the sequential logic can be derived from a programmable logic device. Regardless of how controller 54 is formed, controller 54 is able to use standard JTAG methods to control shift registers that, in turn, may write and/or read data to/from external devices to affect the control of such devices. Advantageously, controller 54 receives control signals that are programmed according to off-the-shelf JTAG programming languages, such as STAPL.

It will be appreciated to those skilled in the art having the benefit of this disclosure that the embodiments described herein are believed to be usable either to test, program, or control automated test equipment, or any electronic subcomponent using well-known JTAG methods. The shift register or shift registers normally attributed to each integrated circuit having a JTAG access port can be distributed among integrated circuits which do not have a JTAG access port. Thus, a single controller can be used to control multiple shift registers in order to fool a host computer into believing the JTAG programming language is used to a JTAG-type shift register found within the access port when, in fact, the host is programming a shift register found within the core logic of one or more integrated circuits. It is intended that the following-claims be interpreted to embrace all such modifications and changes. Accordingly, the specification and drawings are to be regarded in an illustrative rather than a restrictive sense.

What is claimed is:

1. Architecture for controlling an electronic subsystem, comprising:
    multiple integrated circuits, each having a plurality of input pins adapted to receive a parallel delivered signal adapted for controlling the corresponding integrated circuit; and
    a single access port residing on one of the multiple integrated circuits, and adapted to receive a serial bit stream or data and convert the serial bit stream into the parallel delivered signal selectively placed onto the plurality of inputs pins of each of said multiple integrated circuits.

2. The architecture as recited in claim 1, wherein the serial bit stream is derived from a host computer operating from an application program compatible with IEEE Std. 1149.1.

3. The architecture as recited in claim 2, wherein the application program comprises the JAM ™ Standard test and Programming Language (STAPL).

4. The architecture as recited in claim 1, wherein the access port comprises:
    an instruction register coupled to receive the serial bit stream from a host computer;
    a controller coupled to receive a clock signal and mode select signal from the host computer; and
    a shift registor coupled to receive the serial bit stream and convert the serial bit stream into the parallel delivered signal dependent on the state of the clock signal and mode select signal received upon the controller.

5. The architecture as recited in claim 4, wherein the controller produces an enable signal upon receiving the clock signal and mode select signal compatible with IEEE Std. 1149.1.

6. The architecture as recited in claim 4, wherein the shift register comprises any shift register within one of the multiple integrated circuits that can receive serialized data and place the serialized data upon the plurality of input pins dependent only on the state of the enable signal.

7. The architecture as recited in claim 4, wherein clock signal and mode select signal are compatible with IEEE Std. 1149.1, and wherein the serialized data is incompatible with IEEE Std. 1149.1.

8. An access port coupled to receive a serial bit stream, and further coupled to receive control signals for controlling the serial bit stream in accordance with IEEE Std. 1149.1, the access port comprising:

a single controller coupled to receive the control signals and produce an enable signal dependent on the slate of the control signals; and a shift register within an integrated circuit absent circuitry compatible with IEEE Std. 1149.1, wherein the shift register is coupled to receive the serial bit stream and the enable signal for sending in parallel each bit of the serial bit stream unto a corresponding conductor of a plurality of conductors arranged upon the integrated circuit.

9. The access port as recited in claim 8, wherein the shift register is an encoder within an analog-to-digital converter.

10. The access port as recited in claim 8, wherein the shift register is an encoder within a digital-to-analog converter.

11. The access port as recited in claim 8, wherein the shift register is any shift register within core logic of the integrated circuit.

12. The access port as recited in claim 8, wherein the shift register is coupled to send in parallel the serial bit stream onto the plurality of conductors during a first time and, during a second time, the shift register is further coupled to receive in parallel a plurality of signals from a respective second plurality of conductors arranged upon the integrated circuit.

13. The access port as recited in claim 12, further comprising:

a multiplexer; and an instruction decoder coupled to decode an instruction within the serial bit stream and, dependent on the instruction, to instruct the multiplexer to send onto an output conductor the serial bit stream or the plurality of signals from the second plurality of conductors.

14. The access port as recited in claim 13, wherein the control signals comprises a clock signal and a mode select signal.

15. The access port as recited in claim 8, further comprising:

a host computer coupled to the access port; and four conductors extending between the host computer and the access port, wherein three of said four conductors are adapted to transfer the serial bit stream, the clock signal and mode selected signal, respectively, to the access port from the host computer, and one of said four conductors is the output conductor.

16. A method for controlling input to and from a plurality of conductors arranged upon at least one integrated circuit, comprising:

sending control signals compliant with IEEE Std. 1149.1 onto a controller; and depending on the status of the control signals, sending an enable signal from the controller to enable a shift register that is non-complaint with IEEE Std. 1149.1 to receive a serial bit stream and placing each bit of the serial bit stream upon corresponding ones of the plurality of conductors during a first time.

17. The method as recited in claim 16, further comprising receiving a parallel set of bits from corresponding ones of the plurality of conductors during a second time and converting the parallel set of bits into a second serial bit stream.

18. The method as recited in claim 17, further comprising, depending on an instruction within the serial bit stream, either placing the serial bit stream or the second serial bit stream upon an output conductor extending from the integrated circuit to a host computer.

19. The method as recited in claim 16, wherein said sending control signals comprises sending a Joint test Action Group (JTAG) complaint clock signal and a test node signal.

* * * * *

UNITED STATES PATENT AND TRADEMARK OFFICE
CERTIFICATE OF CORRECTION

PATENT NO. : 6,918,057 B1
DATED : July 12, 2005
INVENTOR(S) : Brophy et al.

It is certified that error appears in the above-identified patent and that said Letters Patent is hereby corrected as shown below:

<u>Column 8,</u>
Line 44, after "stream", delete "or" and substitute -- of --.
Line 60, after "a shift", delete "registor" and substitute -- register --.

<u>Column 9,</u>
Line 15, after "dependent on the", delete "slate" and substitute -- state --.
Line 21, after "serial bit stream", delete "unto" and substitute -- onto --.

<u>Column 10,</u>
Line 40, after "sending a Joint", delete "test" and substitute -- Test --.
Line 41, after "and a test", delete "node" and substitute -- mode --.

Signed and Sealed this

Second Day of May, 2006

JON W. DUDAS
*Director of the United States Patent and Trademark Office*